(12) United States Patent
Block et al.

(10) Patent No.: US 6,904,554 B2
(45) Date of Patent: Jun. 7, 2005

(54) LOGIC BUILT-IN SELF TEST (BIST)

(75) Inventors: Stefan G. Block, Munich (DE); David R. Rueveni, Taufkirchen (DE)

(73) Assignee: LSI Logic Corporation, Milpitas, CA (US)

(*) Notice: Subject to any disclaimer, the term of this patent is extended or adjusted under 35 U.S.C. 154(b) by 534 days.

(21) Appl. No.: 10/180,634

(22) Filed: Jun. 26, 2002

(65) Prior Publication Data

US 2004/0003330 A1 Jan. 1, 2004

(51) Int. Cl.[7] .................. G01R 31/3177; G01R 31/3183
(52) U.S. Cl. .......................................... 714/733; 714/30
(58) Field of Search .................................... 714/30, 733

(56) References Cited

U.S. PATENT DOCUMENTS 6,308,290 B1 * 10/2001 Forlenza et al. ............ 714/733
6,327,685 B1 * 12/2001 Koprowski et al. ......... 714/733

OTHER PUBLICATIONS

Kakaroudas, A.P. et al.; Hardware and Power Requirements of Self–checking circuits; Electronics, Circuits and Systems, 1999. Proceedings of ICECS '99. The 6th IEEE International Conference on, vol. 3, 5–8 Sep. 1; pp.: 1655–1658.*
Pagey, S., Al–Khalili, A.J.; Application of byte error detecting codes to the design of self–checking circuits; Test Symposium, 1994., Proceedings of the Third Asian, Nov. 15–17, 1994; pp.: 39–44.*

* cited by examiner

*Primary Examiner*—R. Stephen Dildine
(74) *Attorney, Agent, or Firm*—Christopher P. Maiorana, P.C.

(57) ABSTRACT

An apparatus comprising a plurality of flip-flops each comprising (i) a first input, (ii) a second input and (iii) an output, where (a) each of the outputs are coupled to the first input of a subsequent flip-flop to form a chain, (b) the first input of a first of the flip-flops receives a pattern signal, (c) each of the second inputs receives a respective first logic signal, and (d) each of the outputs presents a respective second logic signal in response to the signals received at the first and second inputs, a pattern generator configured to generate the pattern signal, and a checking circuit configured to generate a check signal in response to the second logic signal of a last of the flip-flops. The pattern signal and the first logic signals are generally selected to influence a behavior of the apparatus.

21 Claims, 11 Drawing Sheets

LOGIC BUILT-IN SELF TEST (BIST)

FIELD OF THE INVENTION

The present invention relates to logic test circuits generally and, more particularly, to a logic built in self test (BIST).

BACKGROUND OF THE INVENTION

Conventional testing of integrated circuits (ICs) is expensive and time consuming. Scan testing is no longer considered a feasible approach for cost sensitive testing. In particular, scan testing requires too much time and tester memory. Conventional solutions to cost sensitive testing include using functional test patterns. However, such test patterns are inefficient and often complicated.

With large designs, the scan test approach has several functional limitations. Such limitations include (i) lack of real-time testing and (ii) increased test time as designs increase in size. In particular, to test a device with 30,000 flip-flops (FFs), an automatic test pattern generation (ATPG) tool can generate 1,200 vectors. This results in 36,000,000 clock cycles to test the respective device and a test time of 1,800 ms using a 20 MHz clock. Such an approach also uses a large amount of tester memory.

Conventional built in self test (BIST) approaches have been set up such that some of the registers in the design are configured as pattern generators and other registers are configured to perform cyclical redundancy checks (CRCs). However, such an approach will not work if there is a direct feedback path to the source register. In particular, in conventional BIST approaches the same register cannot be simultaneously configured as a generator and as a CRC.

It would be desirable to implement a test strategy using a built in self test (BIST) rather than scan testing where each of a number of flip-flops is simultaneously implemented as generator and as a CRC.

SUMMARY OF THE INVENTION

The present invention concerns an apparatus comprising a plurality of flip-flops each comprising (i) a first input, (ii) a second input and (iii) an output, where (a) each of the outputs are coupled to the first input of a subsequent flip-flop to form a chain, (b) the first input of a first of the flip-flops receives a pattern signal, (c) each of the second inputs receives a respective first logic signal, and (d) each of the outputs presents a respective second logic signal in response to the signals received at the first and second inputs, a pattern generator configured to generate the pattern signal, and a checking circuit configured to generate a check signal in response to the second logic signal of a last of the flip-flops. The pattern signal and the first logic signals are generally selected to influence a behavior of the apparatus.

The objects, features and advantages of the present invention include providing a method and/or architecture for testing a memory that may (i) provide an efficient and inexpensive approach for testing large designs, (ii) provide real-time testing, (iii) be implemented with a minimal external infrastructure, (iv) provide shorter test times and/or (v) be implemented without eliminating the capability of debugging the memory by traditional approaches (e.g., scan tests or other similar tests).

BRIEF DESCRIPTION OF THE DRAWINGS

These and other objects, features and advantages of the present invention will be apparent from the following detailed description and the appended claims and drawings in which:

DESCRIPTION OF THE PREFERRED EMBODIMENTS

Prototype circuit designs may be built in self test (BIST) and tested on a normal tester. For example, a simple dedicated personal computer (PC) hardware interface may be implemented to perform mass production testing. Designs that implement Joint Test Action Group (JTAG) testing/hardware may also implement an in-circuit test. An example of JTAG hardware may be defined in the JTAG specification IEEE Standard 1149a-1990 and/or IEEE Standard 1149b-1994, which are each hereby incorporated by reference in their entirety. For such testing, two or more BIST chains may be configured through a number of flip-flops, similar to a scan chain in a scan test method. A pattern generator is generally implemented at the beginning of the BIST chains. A cyclical redundancy check (CRC) circuit is generally implemented at the end of the BIST chains.

Figure 1:
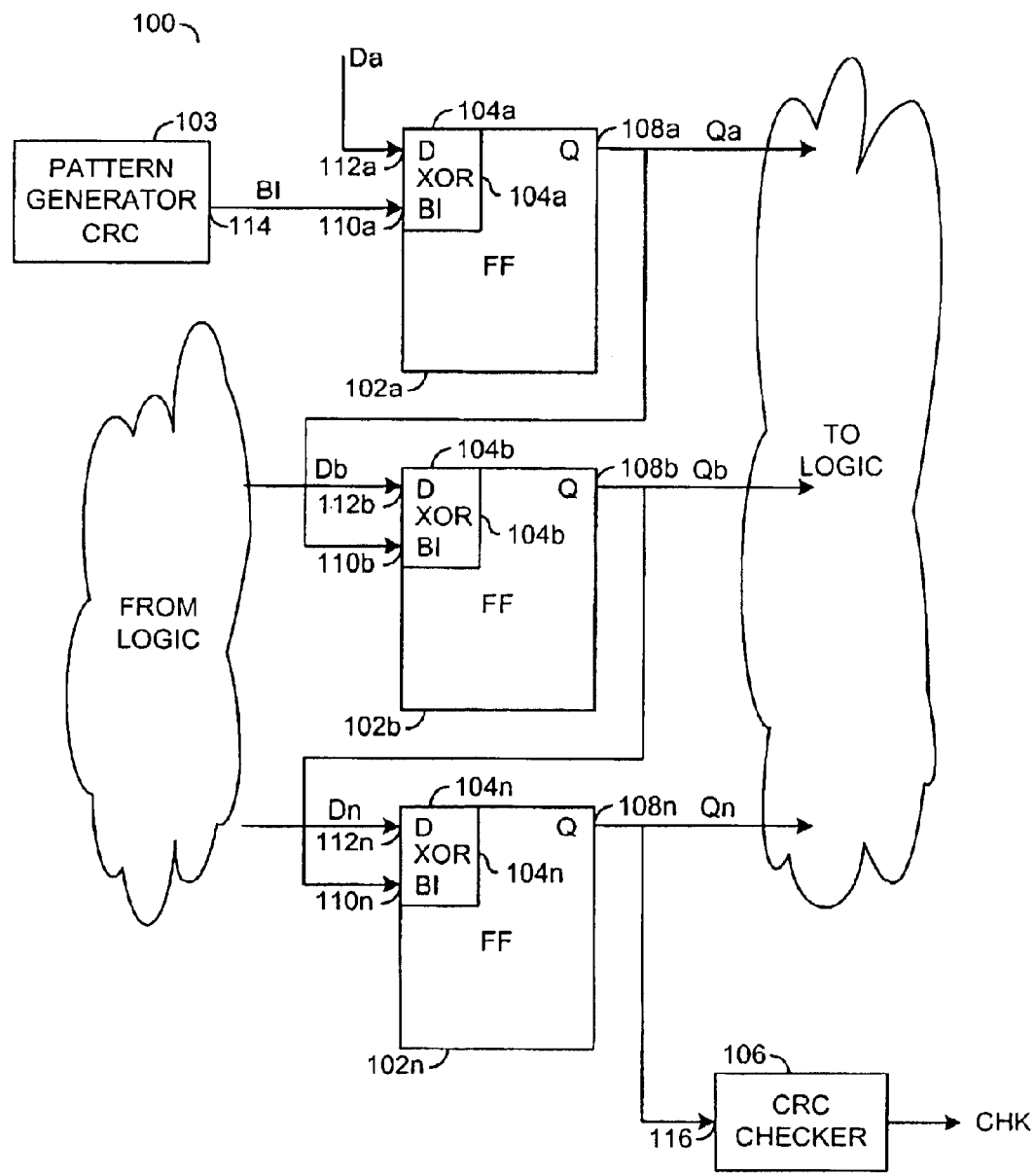
FIG. 1 is a diagram of a preferred embodiment of the present invention in a single BIST chain configuration.

Referring to FIG. 1, a diagram of a circuit 100 illustrating a single BIST chain configuration is shown in accordance with a preferred embodiment of the present invention. The circuit 100 is generally implemented in connection with a circuit design to be tested. The circuit 100 generally comprises a number (or plurality) of flip-flops 102a–102n, a pattern generator 103, and a CRC block (or circuit) 106. Each of the flip-flops 102a–102n may include a respective logic portion 104a–104n. Each of the flip-flops 102a–102n may have a data input 112a–112n that may receive a respective data signal (e.g., Da–Dn), a chain input 110a–110n that may receive a chain signal (e.g., BI) and an output 108a–108n that may present a respective output signal (e.g., Qa–Qn).

The flip-flops 102a–102n are generally serially coupled to form a BIST chain 100. In particular, the output 108a of one flip-flop (e.g., 102a) is generally connected to the chain input 110b of the next flip-flop (e.g., 102b) such that the signal of a preceding flip-flop 102i (e.g., Qi) is the chain signal (e.g., BI(i+1)) that is presented to the subsequent (or succeeding) flip-flop 102(i+1) and/or logic generally external to the circuit 100. The signals D and Q may be implemented as logic signals. Each signal Da–Dn may be received from logic generally external to the circuit 100. In one example, each of the signals Da–Dn may be implemented as different signals. In another example, some and/or all of the signals D may be implemented as the same signal. The signals BI and/or D are generally selected (or determined) by a user to influence and/or monitor behavior of the circuit 100 and/or the circuit where the circuit 100 is implemented. The signals D are generally implemented to relate (or correspond) to the test pattern signal BI. The signal D may be generated by the circuit under test where the circuit 100 is implemented in response to design features of the circuit under test. In another example, a signal Qi may be presented as a signal D (i+1). The signal BI may be implemented as a BIST input signal. After a reset, all of the flip-flops 102a–102n are normally in a defined state. Each of the circuits 102 may be configured to generate the respective output signal Q in response to the signals received at the input 110 and 112 (e.g., the signals BI, D, and/or Q).

The pattern generator 103 may have an output 114 that may shift a pseudo random pattern (e.g., the signal BI) into the input 110a of the first flip-flop (e.g., the flip-flop 102a) of the BIST chain 100. The pseudo random pattern BI may be logically combined (e.g., via XOR logic in logic block 104a) with the data signal D (e.g., the signal presented at the D-input 112a of the first flip-flop (e.g., 102a)). If an error is generated (e.g., a stuck-at failure), the error will generally propagate through the BIST chain 100 until the error is captured and detected in the circuit 106. The output 108n of the last flip-flop in the chain 102n generally presents the signal Qn to the input 116 of the CRC 106 as well as the logic external to the circuit 100. The circuit 106 may be configured to detect when errors are generated in receiving the signals BI and/or D and/or generating the signal Q. The CRC circuit 106 may generate and present an output signal (e.g., CHK) that indicates whether a check operation (e.g., routine, process, etc.) of the chain 100 passed or failed (e.g., a GO/NO-GO test signal). While the circuit 100 is described in connection with an XOR function, other appropriate logic functions and/or combinations of logic may be implemented to meet the design criteria of a particular application.

In one example, the pattern generator 103 may be implemented as a 16-bit pattern generator that may produce 2^16–1 different patterns. For a complete test of a device implementing the circuit 100 with 30,000 flip-flops, 2^16+ 30,000 clock cycles may be performed during BIST testing. This results in less than 100,000 clock cycles of test time, which is a considerable improvement over the conventional scan method described in the background section. While an example of a 16-bit pattern generator 103 has been described, other bit-width pattern generators may be implemented to meet the design criteria of a particular implementation.

When a fault simulation is performed, an analysis of the fault coverage may also be performed to determine simulation accuracy. However, since BIST testing is generally a GO/NO-GO test, a BIST test does not generally detect the position of a failure. For debugging, a combination of BIST and scan techniques may be performed. Therefore, in one example, a BIST test for production and prototyping may be conducted, while a scan test may be executed for debugging during design, when desired. A potential problem with the single BIST chain approach is that errors already generated may be cancelled out. However, various additional techniques to be described may be implemented in accordance with the present invention to minimize and/or eliminate such cancellations.

Figure 2:
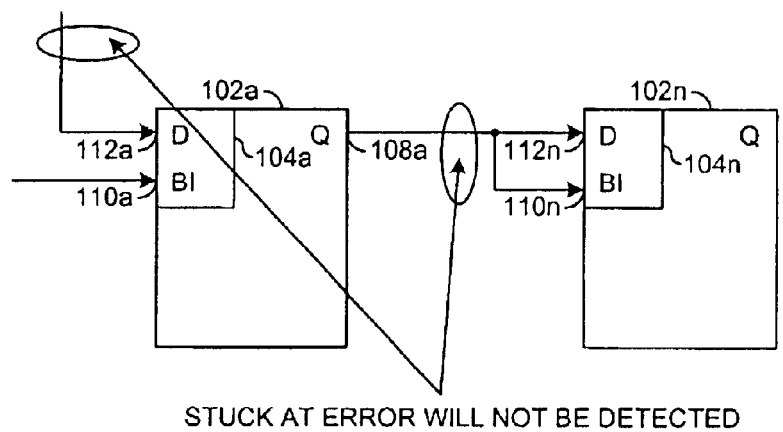
FIG. 2 is a diagram illustrating a stuck error in a single BIST chain configuration.

Referring to FIG. 2, an example of an undetected stuck error is shown. An example of a BIST chain and functional path from the output 108a of a source flip-flop 102a, an input 110n and an input 112n of a target flip-flop 102n is shown. When a single BIST chain is implemented having an even number of flip-flops 102a–102n, the XOR logic 104a–104n may cancel the error since both inputs of the XOR are generally inverted if an error is generated. However, a dual BIST approach (to be described in connection with FIG. 3) generally minimizes and/or eliminates such cancellation.

Figure 3:
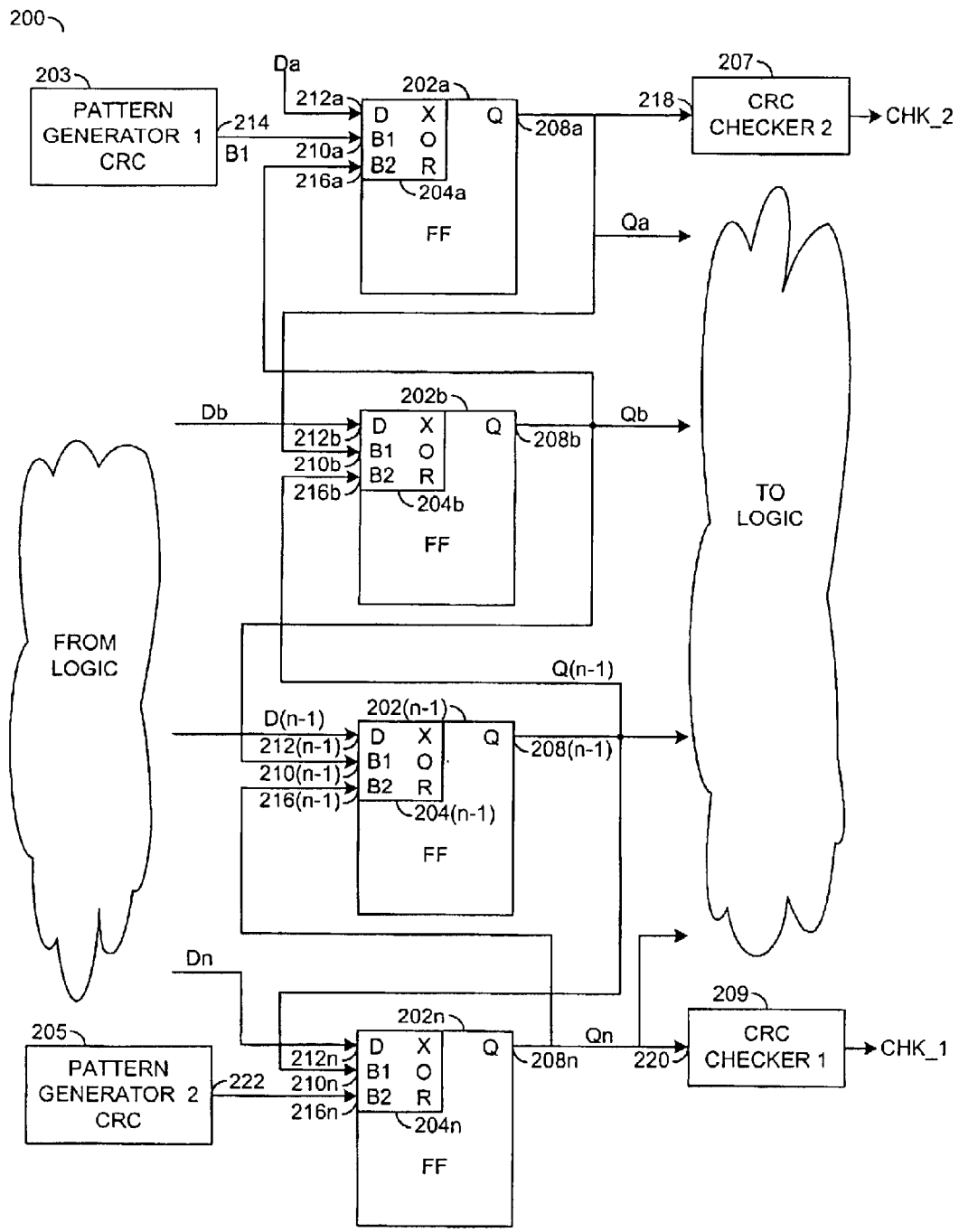
FIG. 3 is a diagram illustrating an embodiment of the present invention in a dual BIST chain configuration.

Referring to FIG. 3, a diagram of a circuit 200 illustrating a dual BIST chain configuration is shown. The circuit 200 generally comprises a number of flip-flops 202a–202n, a first pattern generator 203, a second pattern generator 205, a first CRC block (or circuit) 209, and a second CRC block (or circuit) 207. Each of the flip-flops 202a–202n generally includes a respective logic portion (e.g., 204a–204n). The circuit 200 may be implemented similarly to the circuit 100. Each of the flip-flops 202a–202n may have a data input 212a–212n that may receive the respective data signal D, a first chain input 210a–210n that may receive a respective first chain (or BIST input) logic signal (e.g., B1a–B1n), a second chain input 216a–216n that may receive a respective second chain (or BIST input) logic signal (e.g., B2a–B2n) and an output 208a–208n that may present the respective output signal (e.g., Q). The signals B1 and B2 may be implemented similarly to the signal BI. The flip-flops 202a–202n are generally serially cascaded and configured as two BIST chains.

In one example, the output 208b of the flip-flop 202b is generally connected to the input 210(n–1) of the subsequent (or successor) flip-flop 202(n–1) to form a first chain and an input 216a of predecessor flip-flop 202a to form a second chain. The signal Qi is generally presented (i) to the immediately previous (or predecessor) flip-flop 202(i–1) as the signal B2 (i–1) and (ii) to the successor flip-flop 202(i+1) as the signal B1 (i+1) to form a dual BIST chain. The dual BIST chain 200 is generally configured such that any generated errors propagate in both directions (e.g., towards the beginning of the chain (e.g., towards the flip-flop 202a) and towards the end of the chain (e.g., towards the flip-flop 202n) and error cancellation is minimized and/or eliminated. The first flip-flop in the chain (e.g., 202a) may have an input 212a that may receive the signal D, an input 210a that may receive the pseudo-random pattern signal B1 generated by the pattern-generator 203, an input 216a that may receive the output signal Qb of the next flip-flop (e.g., 202b) and an output 208a that may be connected to an input 218 of the second CRC circuit 207 and the input 210b of the successive flip-flop 202b such that the signal Qa is presented to the circuit 207 and is presented as the signal B1b to the flip-flop 202b.

The last flip-flop in the dual BIST chain 200 (e.g., the flip-flop 202n) may have an input 212n that may receive the logic signal D, an input 210n that may receive output signal Q(n−1) from the predecessor flip-flop 202(n−1) as the signal B1n, an input 216n that may receive the pseudo-random pattern signal B2 from the second pattern generator 205 as the signal B2n, and an output 208n that may present the signal Qn to an input 220 of the first CRC circuit 209. The circuit 200 may be configured as two BIST chains. The circuit 200 may obviate the potential stuck error problem of the single BIST chain approach of the circuit 100. Each chain of the circuit 200 may be fed by a pattern generator (e.g., the circuits 203 and 205, respectively, that may be implemented similarly to the circuit 103) and each chain may end in a CRC circuit (e.g., the circuits 207 and 209 that generate respective output check signals CHK_2 and CHK_1).

The two pattern generators 203 and 205 generally implement different CRC polynomials and/or counting sequences (e.g., the signal B2 is generally different from the signal B1). The implementation of different CRC polynomials may ensure that different patterns are generated. Exemplary polynomials may include non-recurring CRC polynomial and/or signature patterns generated by well-known pseudo-random number generator techniques. Similarly, unweighted and/or weighted counting sequences may be implemented as the signals B1 and B2. In one example, weighted counting sequences may be implemented in connection with so-called weighted test vectors. The weighted counting sequences may be implemented as any appropriate pattern (e.g., binary, etc.) to meet the design criteria of a particular application. However, other appropriate polynomials and/or counting sequences may be implemented to meet the design criteria of a particular application.

The dual BIST approach of the circuit 200 may reduce the likelihood that an error that is generated in the circuit 200 will be cancelled because an error will generally propagate in both directions (e.g., in both chains). In particular, the likelihood that both errors would get cancelled is reduced when compared to a single BIST chain approach.

The following TABLE 1 illustrates how the error may propagate through the flip-flop chain 200 in both directions:

flip-flops 202g–202i and the flip-flops 202g'–202i' which may be implemented similarly to the flip-flop 202g–202i generally represent the BIST flip-flop chain 200 cascaded horizontally and configured as a shift register. The output signal Qg (presented by the flip-flop 202g) may be presented to the flip-flop 202h as the signal Dh (e.g., to the input 212h) as well as the signal B1h (e.g., to the input 210h).

If the functional path (e.g., the circuits 202g–202i) and the BIST path (e.g., the circuits 202g'–202i') from a source flip-flop (e.g., flip-flop 202g) end at the same target flip-flop (e.g., 202h) in a shift register, an error cancellation may occur. Such an error cancellation generally occurs for both the single BIST chain approach (e.g., the circuit 100) and the dual BIST chain approach (e.g., the circuit 200). Errors in front of the illustrated adjacent flip-flop outputs (e.g., 208g, 208g') may be cancelled and may not generally shift (or propagate) through the BIST chain.

Figure 4:
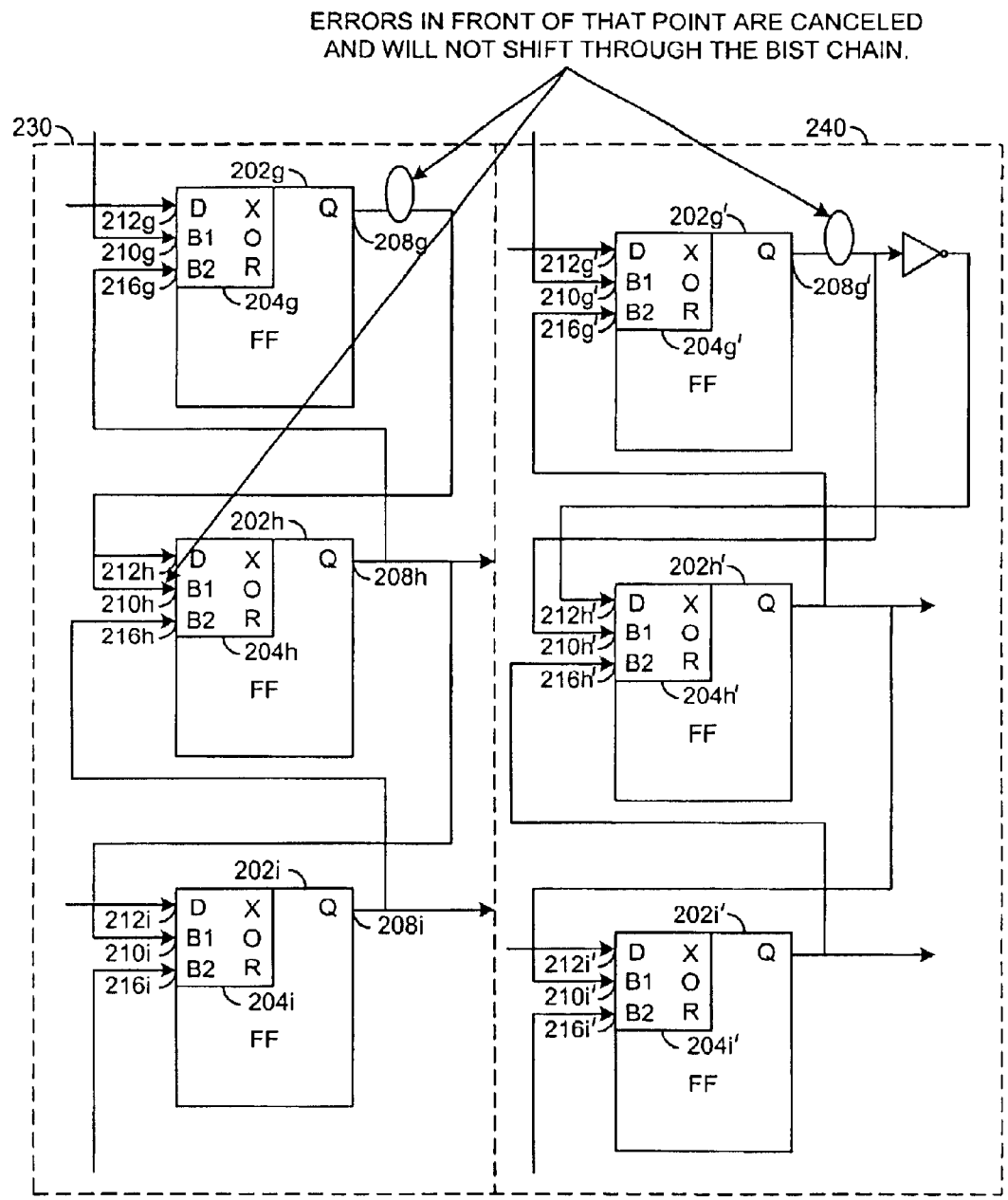
FIG. 4 is a diagram illustrating error cancellation during shifting.
Figure 5:
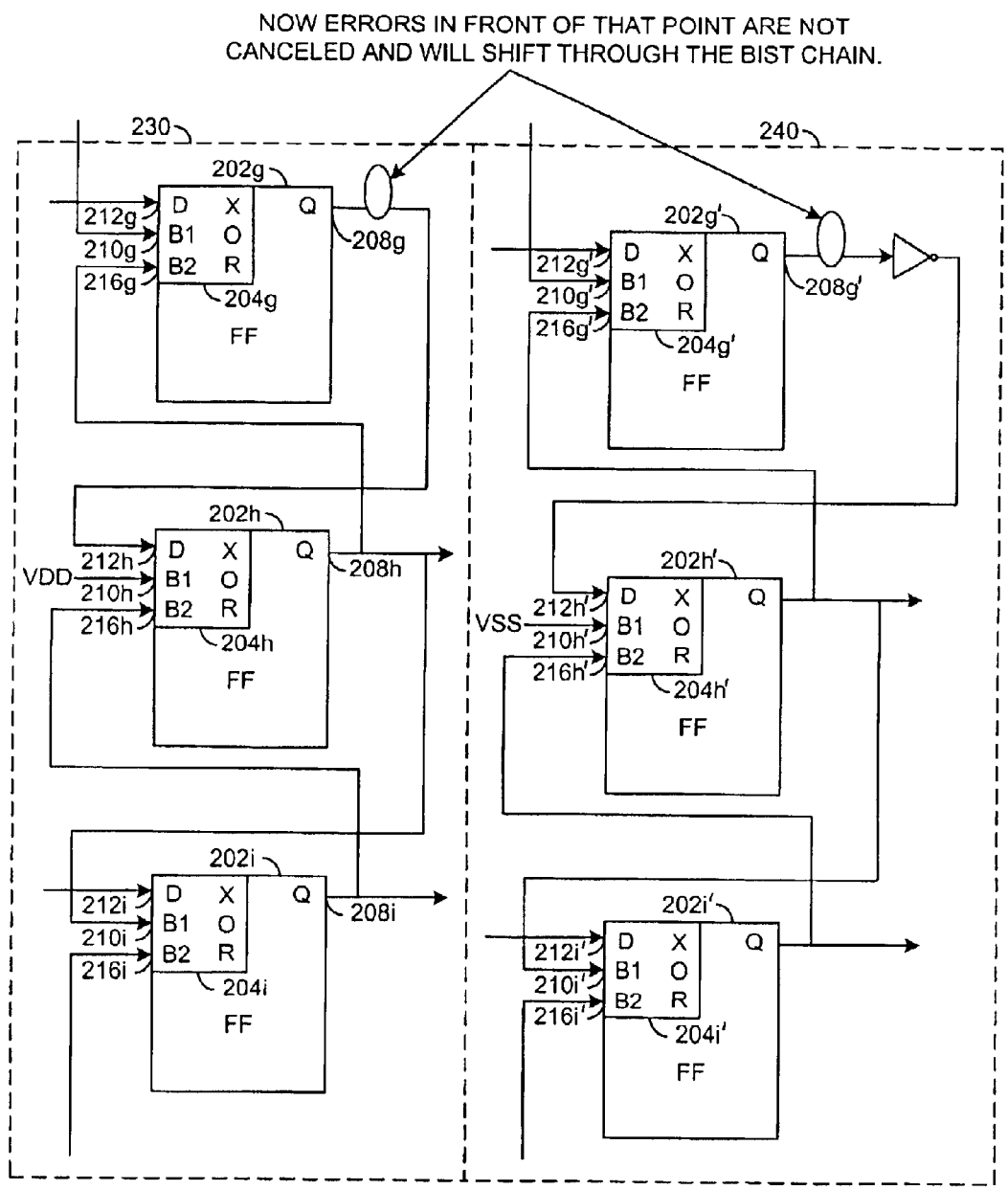
FIG. 5 is a diagram illustrating a solution to error cancellation during shifting.

Referring to FIG. 5, an example of a solution to error cancellation during the shifting example of FIG. 4 is shown. To reduce and/or eliminate error cancellation, the BIST path is generally checked (e.g., monitored). If the functional path and the BIST path from a source flip-flop (e.g., 202g) end at the same target flip-flop (e.g., 202h) in a shift register, the functional path for the BIST is generally implemented. The BIST path is generally removed from the target flip-flop 202h and the BIST signals B1 (e.g., the signals presented to the inputs 210h and 210h') are generally connected to a supply voltage (e.g., VSS or VDD) and a ground potential (e.g., VSS), respectively. Various possible architectures of BIST flip-flops 202a–202n (to be described in connection with FIGS. 7–16) may be implemented. With the approach of the present invention, cancellation of errors in front of the illustrated adjacent flip-flop outputs (e.g., 208g and 208g') may be eliminated and the errors will generally shift through the respective BIST chain.

One benefit of the present invention includes real time testing. For designs with more than one clock domain, each clock domain may implement a distinct BIST chain and each clock domain may operate at a different frequency. If the

TABLE 1

| FF in chain | n−8 | n−7 | n−6 | n−5 | n−4 | n−3 | n−2 | n−1 | n | n+1 | n+2 | n+3 | n+4 | n+5 | n+6 | n+7 | n+8 |
|---|---|---|---|---|---|---|---|---|---|---|---|---|---|---|---|---|---|
| | | | | | | | | | x | | | | | | | | |
| | | | | | | | x | | x | | | | | | | | |
| | | | | | | x | | c | | x | | | | | | | |
| | | | | | x | | x | | x | | x | | | | | | |
| | | | | x | | c | | c | | c | | x | | | | | |
| | | | x | | x | | | | | | x | | x | | | | |
| | | x | | c | | x | | | | | x | | c | | x | | |
| | x | | x | | x | | x | | x | | x | | x | | x | | |
| x | | c | | c | | c | | c | | c | | c | | c | | x |

The Xs indicate errors. The Cs indicate cancelled errors (e.g., due to an XOR of two errors). An error will normally propagate in both directions. In general, there will be at least two inverted bits in the BIST chain when an error is generated. If one of the two bit inversions is eliminated (e.g., cancelled, dropped out, etc.), the remaining error generally continues to duplicate and propagate in both directions. Hence, the likelihood that an error will be completely cancelled is minimized and/or eliminated when the dual BIST chain approach of the circuit 200 is implemented.

Referring to FIG. 4, a diagram illustrating an error cancellation during shifting in a dual BIST chain is shown. The functional data transfer operates properly, the data transfer during the BIST test will also generally operate properly. With designs implemented having phase lock loops (PLLs), testing the respective device while the PLL is active (as opposed to testing with the PLL bypassed) may be conducted. A JTAG controller may also be implemented to control the BIST test. In such an implementation, additional chip pins may not be needed for a BIST test. In particular, JTAG boundary scan registers may be combined with a BIST chain to be implemented as a pattern generator and as a pattern observer. If JTAG is combined with BIST, the test of the device may be performed with chips mounted in a system which may result in shorter test times during a production test since each clock cycle is represented with a new test vector.

Additional options may be implemented such as (i) splitting long chains into shorter chains to reduce the test time, (ii) implementing pattern generators and CRCs that may be shared between different chains that implement the same clock source, and/or (iii) implementing designs that may be combined with JTAG devices to implement a low pin count tester implementation. Alternatively, all inputs and outputs may be configured to participate actively in the BIST test. Additional CRCs may be implemented at any location in the BIST chain such that long chains may be more easily observed.

Figure 6:
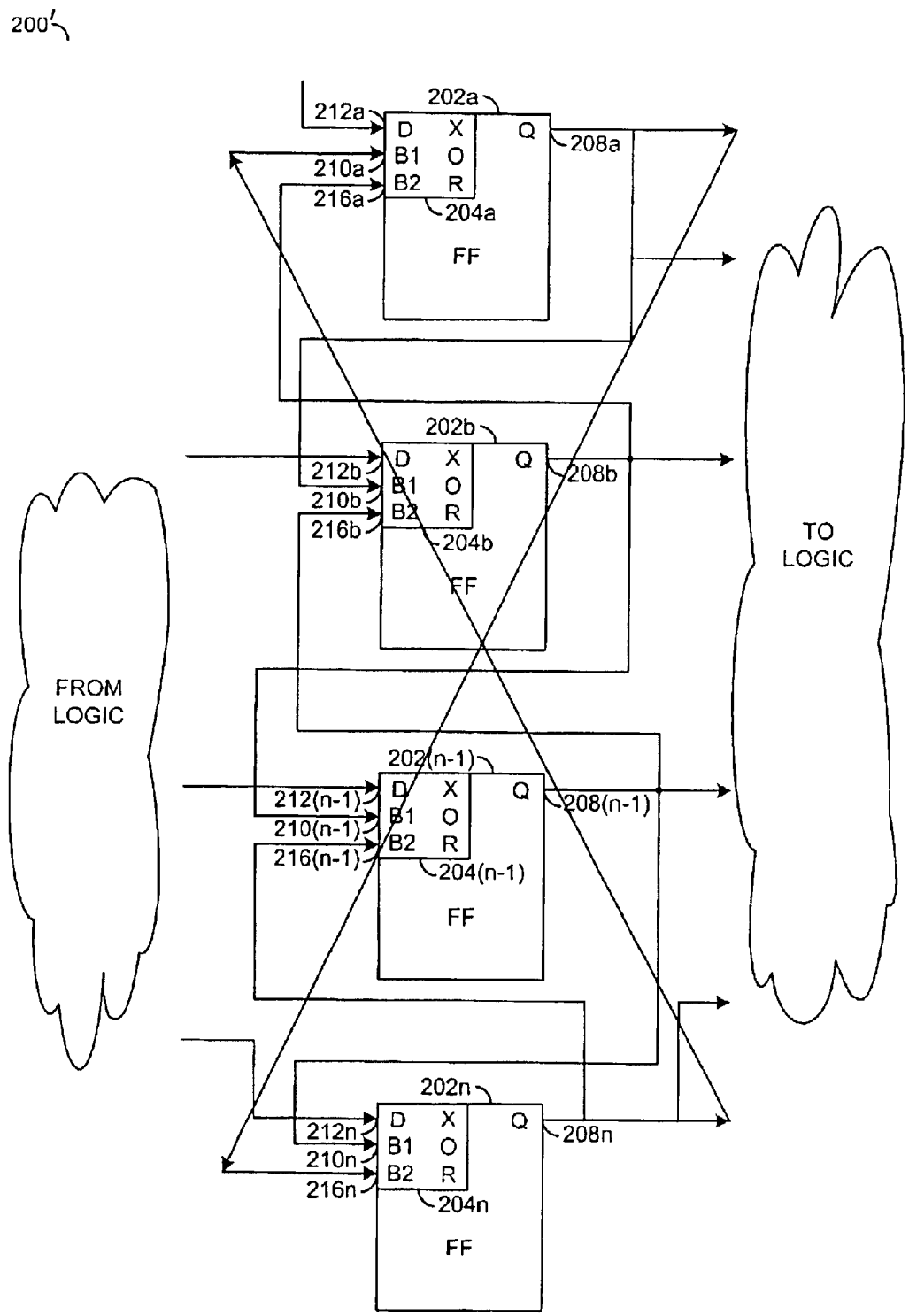
FIG. 6 is a diagram illustrating an alternative dual BIST chain configuration.

Referring to FIG. 6, a diagram of a circuit 200' illustrating an alternative dual BIST chain configuration is shown. The circuit 200' may be implemented similarly to the circuit 200. In the circuit 200', the pattern generators 203 and 205 and CRCs 207 and 209 are deleted. The input 210a of the flip-flop 202a is generally connected to the output 208n of the flip-flop 202n (e.g., the signal Qn may be presented as the signal B1a). The input 216n of the flip-flop 202n is generally connected to the output 208a of flip-flop 202a (e.g., the signal Qa may be presented as the signal B2n). Such an implementation may be implemented having less additional logic (e.g., the circuit 200' may be implemented without the pattern generators 203 and 205 and the CRCs 207 and 209). Any appropriate primary chip input and/or combination of chip inputs may be implemented to input test data (e.g., as one or more of the signals Da–Dn), and any appropriate primary chip output or combination of chip output signals Qa–Qn may be implemented to monitor the test results. A disadvantage of the circuit 200' may be the lack of a pre-defined CRC polynomial, signature pattern, etc. To overcome the potential disadvantage, the user may verify that the chain 200' produces a pattern. Alternatively, inverters may be implemented into the chain 200' and/or data may be presented to the primary inputs (e.g., the inputs of the flip-flop 202') to ensure activity in the chain (e.g., to ensure flip-flops 102 and/or logic 104 is exercised).

Figure 7:
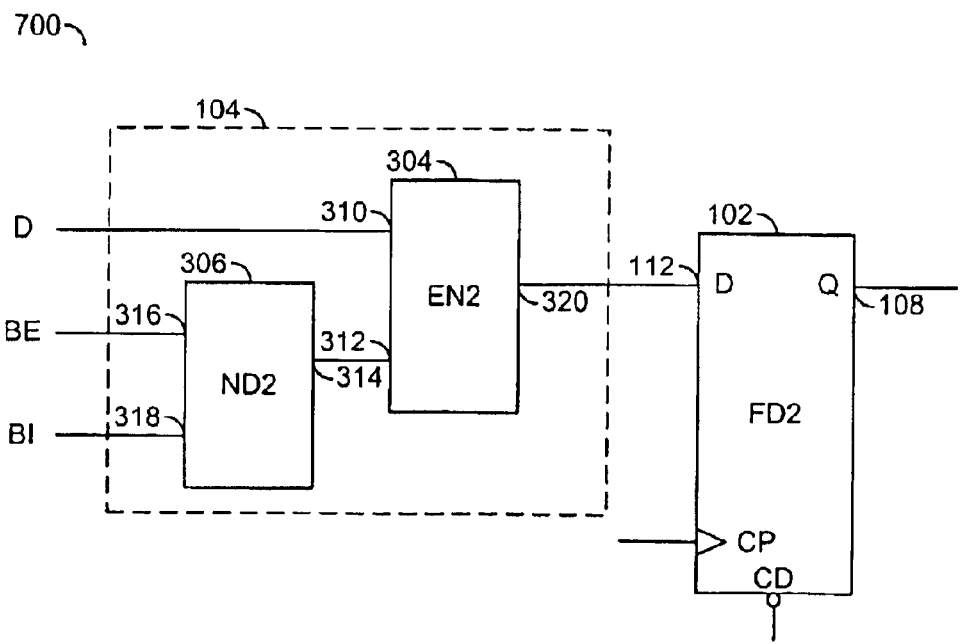
FIG. 7 is an example of a flip-flop configured as an element of a single BIST chain without scan.

Referring to FIG. 7, a diagram of a circuit 700 illustrating an example of a flip-flop that may be implemented in a single BIST chain without scan is shown. The circuit 700 may be representative of the flip-flop 102 and the logic block (or circuit) 104 of FIG. 1. The circuit 102 generally has a clock (e.g., CP) input and a reset (e.g., CD) input. The logic block 104 generally comprises a block (or circuit) 304 and a block (or circuit) 306. The circuit 304 may be implemented as a logic circuit, such as an XNOR gate. The circuit 306 may be implemented as another logic circuit, such as an AND gate. However, any appropriate logic may be implemented to meet the design criteria of a particular application. The signal (or pin) BE may be implemented as a BIST enable signal, where a logic HIGH (e.g., on or 1) may enable the BIST mode. Alternatively, when the signal BE is LOW (e.g., off or 0) the circuit 700 may be operated in a scan mode. The signal (or pin) BI may be a BIST-input (or chain) signal. The signal (or pin) D may be the flip-flop input signal.

The circuit 304 may have an output 320 that is generally connected to the input 112 of the flip-flop 102. The circuit 304 may have a first input 312 connected to an output 314 of circuit 306 and a second input 310 that may receive the signal D. The circuit 306 may have a first input 316 that may receive the signal BE and a second input 318 that may receive the signal BI. A number of the flip-flop circuits 700 may be cascaded (e.g., vertically, serially, etc.) as illustrated in FIG. 1 and configured as a single BIST chain. While an AND gate and an XNOR gate have been described, any appropriate circuits and/or combinations of circuits may be implemented to meet the design criteria of a particular application.

Figure 8:
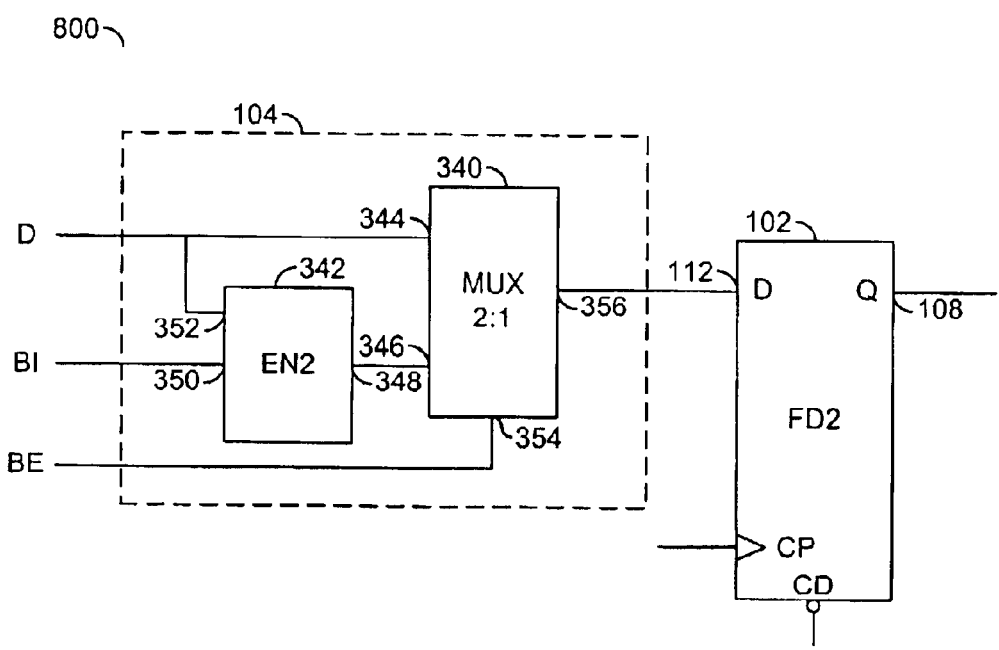
FIG. 8 is another example of a flip-flop configured as an element of a single BIST chain without scan.

Referring to FIG. 8, a diagram of a circuit 800 illustrating another example of flip-flops 102a–102n that may be implemented as a single BIST chain without scan is shown. The circuit 800 generally comprises a flip-flop 102 and a logic block (or circuit) 104 of FIG. 1. The circuit 800 generally comprises a multiplexer 340 and a logic block (or circuit) 342. The circuit 342 may be implemented as an XNOR gate. The circuit 800 may be implemented similarly to the circuit 200. An output 356 of the multiplexer 340 is generally coupled to the input 112 of the flip-flop 102. The multiplexer 340 may have a first input 346 coupled to an output 348 of the circuit 342, a second input 344 that may receive the data signal D and a control input 354 that may receive the signal BE. The multiplexer 340 may be configured to select the signal D or the signal BI as the signal presented to the input 112 of the flip-flop 102 in response to the signal BE. The logic circuit 342 may have a first input 350 that may receive the signal BI and a second input 352 that may receive the data signal D. A number of the flip-flop circuits 800 may be generally cascaded (e.g., vertically, horizontally, etc.) as illustrated in FIG. 1 and configured as a BIST single chain. While a multiplexer and an XNOR gate have been described, any appropriate circuits and/or combination of circuits may be implemented to meet the design criteria of a particular application.

Figure 9:
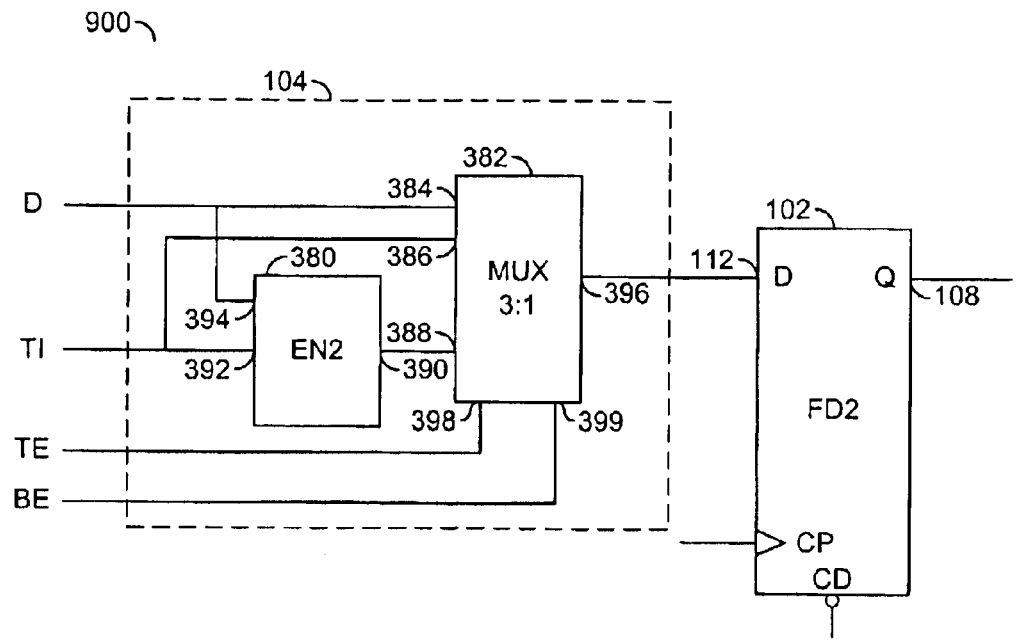
FIG. 9 is an example of a flip-flop configured as an element of a single BIST chain with scan.

Referring to FIG. 9, a diagram of a circuit 900 illustrating an example of a flip-flop that may be implemented as a single BIST chain flip-flop with a scan feature is shown. The BIST may be implemented as a GO/NO-GO test in production and the scan may be implemented as a debugging aid. In one example, failed parts may be scanned to identify the failure location and/or cause. The circuit 900 generally comprises a flip-flop 102 and a logic block 104. The circuit 900 may be implemented similarly to the circuit 700. The logic block 104 generally comprises a block (or circuit) 380 and a multiplexer 382. The circuit 380 may be implemented as a logic circuit, such as an XNOR gate. However, any appropriate logic may be implemented to meet the design criteria of a particular application.

The signal (or pin) TE may be a test and/or scan enable signal, where a logic HIGH may enable the test (or scan) mode. The signal (or pin) TI may be a BIST-in and/or scan-in signal. The signal TI may be presented to the input 110 of the circuit 102 in lieu of the signal BI. The multiplexer 382 may be configured to present the signal D or TI to the input 112 in response to the signals TE and/or BE.

The circuit 382 may have a first input 384 that may receive the data signal D, a second input 386 that may receive the signal TI, a third input 388 that may be coupled to the output 390 of the circuit 380, a fourth input 398 that may receive the signal TE, and a fifth input 399 that may receive the control signal BE. The circuit 382 may have an output 396 which is generally connected to the input 112 of the flip-flop 102. The circuit 380 may have a first input 392 that may receive the signal TI and a second input 394 that may receive the data signal D. The multiplexer 382 may be configured to select the signal D or the signal TI as the signal presented to the input 112 of the flip-flop 102 in response to the signals TE and BE. A number of the flip-flops 900 may be serially cascaded (e.g., vertically, horizontally, etc.) as illustrated in FIG. 1 and configured as a single BIST chain. While an XNOR gate and a multiplexer have been described, any appropriate circuits and/or combination of circuits may be implemented to meet the design criteria of a particular application.

Figure 10:
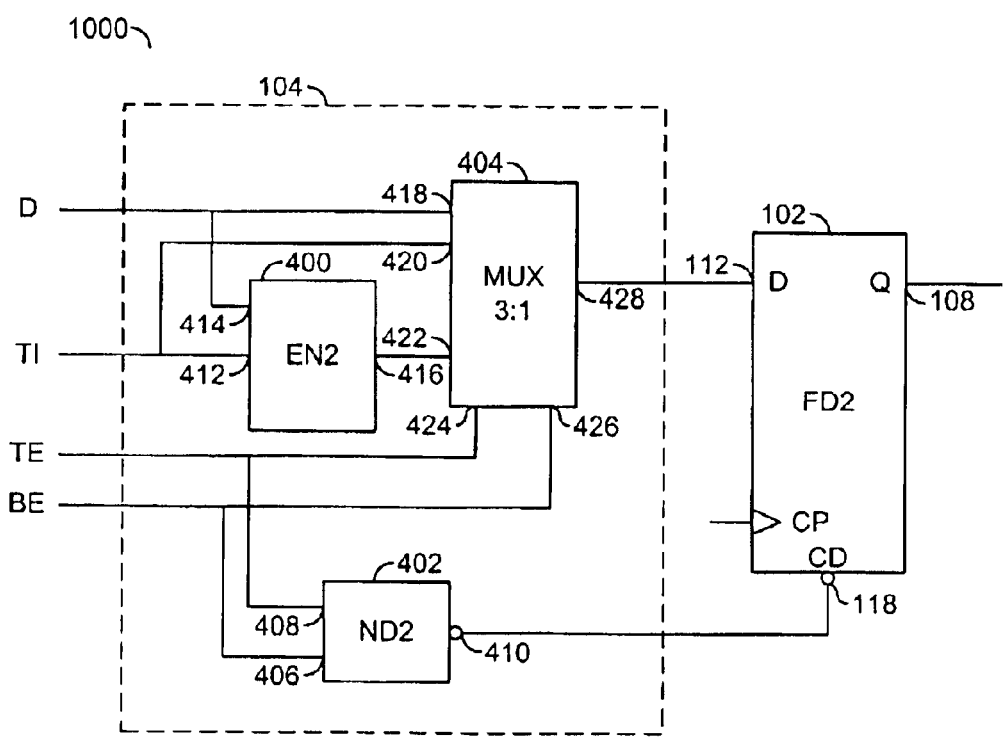
FIG. 10 is an example of a flip-flop configured as an element of an alternative single BIST chain with scan and asynchronous reset.

Referring to FIG. 10, a diagram of a circuit 1000 illustrating an example of a flip-flop 102 that may be implemented as an alternative single BIST chain flip-flop with a scan and asynchronous reset is shown. The circuit 1000 may be implemented similarly to the circuits 700 and/or 900. The circuit 1000 may be implemented having less than four global input signal networks (e.g., clock, reset, test-enable and BIST-enable). Full functionality may be obtained via three global networks (e.g., clock, test-enable and BIST-enable).

The circuit 1000 generally comprises a flip-flop 102 and a logic block (or circuit) 104. The circuit 104 generally comprises a block (or circuit) 400, a block (or circuit) 402 and a multiplexer 404. The circuit 400 may be implemented as a logic circuit, such as an XNOR gate. The circuit 402 may be implemented as an AND gate. However, any appropriate logic may be implemented to meet the design criteria of a particular application.

The circuit 400 may have a first input 412 that may receive the signal TI and a second input 414 that may receive the signal D. The circuit 404 may have a first input 422 that may be coupled to the output 416 of the circuit 400, a second input 420 that may receive the signal TI, a third input 418 that may receive the data signal D, a fourth input 424 that may receive the signal TE, and a fifth input 426 that may receive the control signal BE. The circuit 404 may have an output 428 that is generally coupled to the input 112 of the flip-flop 102. The output 410 of the circuit 402 generally presents the reset input signal CD to the input 118 of the flip-flop 102. The circuit 402 may have a first input 406 that may receive the control signal BE and a second input 408 that may receive the signal TE. A number of the circuits 1000 may be serially cascaded, for example, vertically, as illustrated in FIG. 1 and configured as a single BIST chain. While a multiplexer, an AND gate and an XNOR gate have been described, any appropriate circuits and/or combinations of circuits may be implemented to meet the design criteria of a particular application.

The following TABLE 2 is a truth table illustrating example operating modes of the BIST flip-flop 1000 with scan and asynchronous reset in response to the signals TE and BE:

TABLE 2

| TE | BE | operation mode |
|---|---|---|
| 0 | 0 | functional (D => Q) |
| 0 | 1 | BIST |
| 1 | 0 | SCAN (TI => Q) |
| 1 | 1 | async. reset (0 => Q) |

Figure 11:
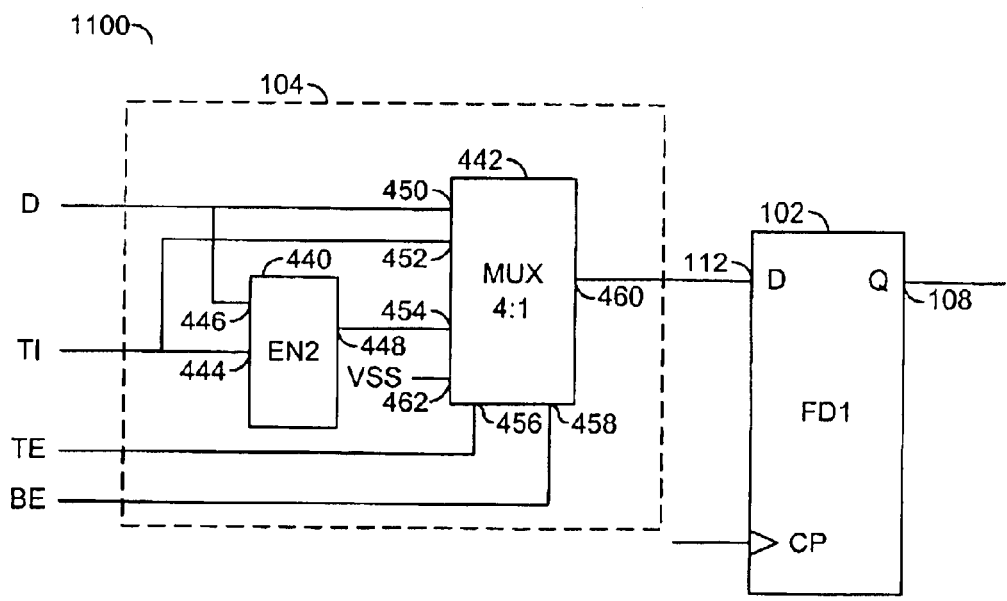
FIG. 11 is an example of a flip-flop configured as an element of a single BIST chain with scan and synchronous reset.

Referring to FIG. 11, a diagram of a circuit 1100 illustrating an example of a flip-flop that may be configured as a single BIST flip-flop with scan and synchronous reset is shown. The circuit 1100 may be implemented similarly to the circuits 700 and/or 900. The circuit 1100 generally comprises a flip-flop 102 and a logic block (or circuit) 104. The circuit 104 generally comprises a block (or circuit) 440, and a multiplexer 442. The circuit 440 may be implemented as a logic circuit, such as an XNOR gate. However, any appropriate logic may be implemented to meet the design criteria of a particular application.

The circuit 440 may have a first input 444 that may receive the signal TI and a second input 446 that may receive the signal D. The circuit 442 may have a first input 454 coupled to the output 448 of the circuit 440. The circuit 442 may have a second input 452 that may receive the signal TI, a third input 450 that may receive the data signal D, a fourth input 456 that may receive the signal TE, a fifth input 458 that may receive the control signal BE and a sixth input 462 that may receive the ground potential VSS. An output 460 of circuit 442 is generally coupled to the input 112 of the flip-flop 102. A number of the circuits 1100 may be serially cascaded, for example, vertically, as illustrated in FIG. 1 and configured as a single BIST chain. While a multiplexer and an XNOR gate have been described, any appropriate circuits and/or combinations of circuits may be implemented to meet the design criteria of a particular application.

The following TABLE 3 is a truth table illustrating example operating modes of the single BIST flip-flop 1100 with scan and synchronous reset in response to the signals TE and BE:

TABLE 3

| TE | BE | operation mode |
|---|---|---|
| 0 | 0 | functional (D => Q) |
| 0 | 1 | BIST |
| 1 | 0 | SCAN (TI => Q) |
| 1 | 1 | sync. reset (0 => Q) |

Figure 12:
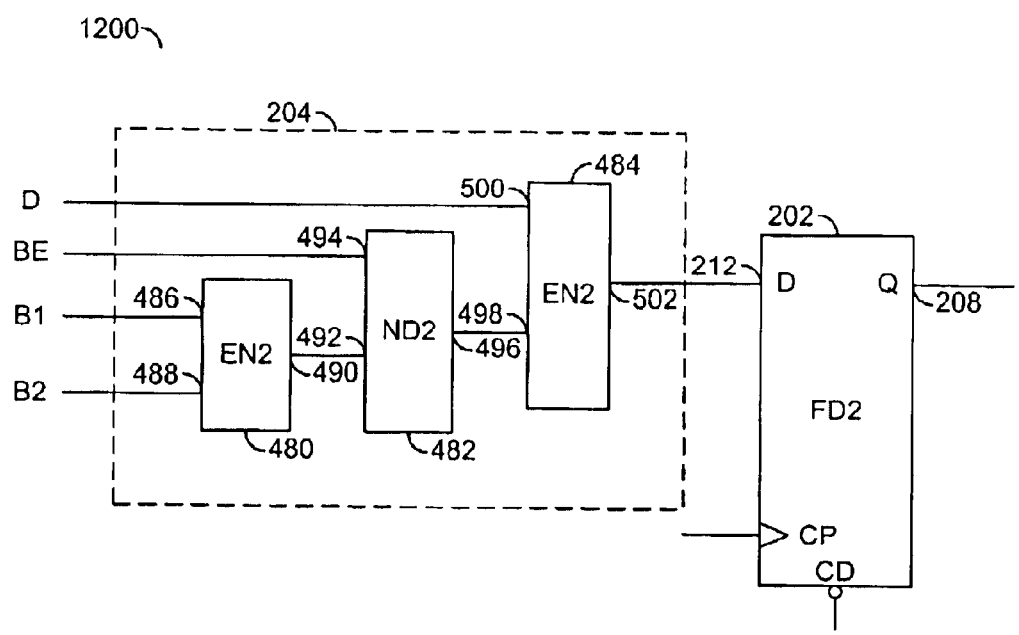
FIG. 12 is an example of a flip-flop configured as an element of a dual BIST chain configuration.

Referring to FIG. 12, a diagram of a circuit 1200 illustrating an example of a flip-flop that may be implemented in a dual BIST chain without scan is shown. The circuit 1200 may be implemented similarly to the circuit 700. The circuit 1200 may be representative of the flip-flop 202 and the logic block (or circuit) 204 of FIG. 3. The circuit 1200 generally comprises a flip-flop 202 and a logic block (or circuit) 204. The circuit 204 generally comprises a block (or circuit) 480, a block (or circuit) 482, and a multiplexer 484. The circuit 480 may be implemented as a logic circuit, such as an XNOR gate. The circuit 482 may be implemented as another logic circuit such as an AND gate. However, any appropriate logic may be implemented to meet the design criteria of a particular application. The signal (or pin) B1 may be a BIST-in 1 signal. The signal (or pin) B2 may be a second BIST-in (e.g., a BIST-in 2) signal. The signal (or pin) D may be the flip-flop input signal.

The circuit 480 may have a first input 486 that may receive the signal B1 and a second input 488 that may receive the signal B2. The circuit 482 may have a first input 492 that may be coupled to the output 490 of the circuit 480 and a second input 494 that may receive the control signal BE. The circuit 484 may have a first input 498 that may be coupled to the output 496 of the circuit 482 and a second input 500 that may receive the data signal D. The circuit 484 may have an output 502 that is generally coupled to the input 212 of the flip-flop 202. A number of the circuits 1200 may be serially cascaded, for example, vertically, as illustrated in FIG. 3 and configured as a dual BIST chain. While a multiplexer, an AND gate, and an XNOR gate have been described, any appropriate circuits and/or combinations of circuits may be implemented to meet the design criteria of a particular application.

Figure 13:
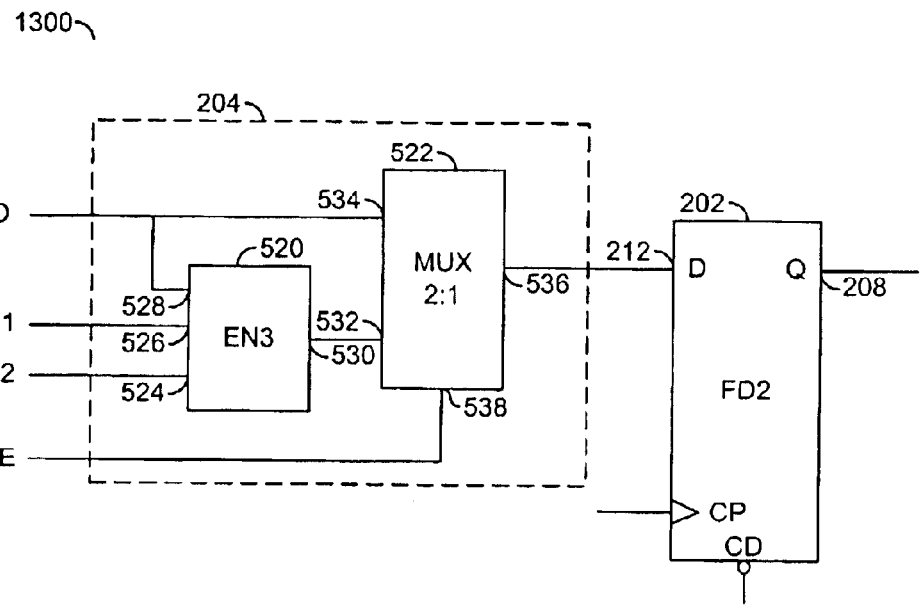
FIG. 13 is another diagram illustrating an example of a flip-flop configured as an element of a dual BIST chain configuration.

Referring to FIG. 13, a diagram of a circuit 1300 illustrating an example of a flip-flop that may be implemented as a dual BIST chain flip-flop without scan is shown. The circuit 1300 may be implemented similarly to the circuits 700 and/or 1200. The circuit 1300 generally comprises a flip-flop 202 and a logic block (or circuit) 204. The circuit 204 generally comprises a block (or circuit) 520 and a multiplexer 522. The circuit 520 may be implemented as a logic circuit, such as an XNOR gate. However, any appropriate logic may be implemented to meet the design criteria of a particular application.

The circuit 520 may have a first input 524 that may receive the signal B2, a second input 526 that may receive the signal B1, and a third input 528 that may receive the data signal D. The circuit 522 may have a first input 532 that may be coupled to the output 530 of the circuit 520, a second input 534 that may receive the data signal D, and a third input 538 that may receive the control signal BE. The circuit 522 may have an output 536 that is generally coupled to the input 212 of the flip-flop 202. A number of the flip-flop circuits 1300 may be serially cascaded, for example, vertically, as illustrated in FIG. 3 and configured as a dual BIST chain. While an XNOR gate and a multiplexer have been described, any appropriate circuits and/or combinations of circuits may be implemented to meet the design criteria of a particular application.

Figure 14:
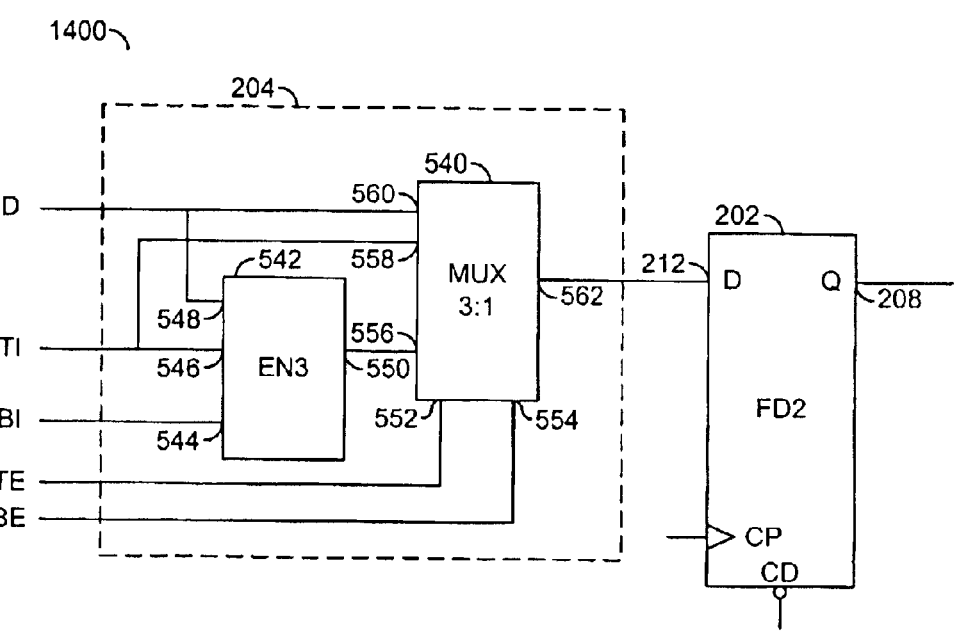
FIG. 14 is a diagram illustrating an example of a dual BIST flip-flop approach with scan.

Referring to FIG. 14, a diagram of a circuit 1400 illustrating an example of a flip-flop that may be implemented as a dual BIST chain flip-flop with scan is shown. The circuit 1400 may be implemented similarly to the circuit 1200. BIST may be combined with scan. When BIST and scan capabilities are combined, the BIST may be implemented as a GO/NO-GO test in production and the scan may be implemented as a debugging aid. When the circuit 1400 is implemented as an element of a dual BIST/scan chain, failed parts may be scan tested to identify the failure location mode, and/or cause. The circuit 1400 generally comprises a flip-flop 202 and a logic block (or circuit) 204. The circuit 204 generally comprises a multiplexer 540, and a block (or circuit) 542. The circuit 542 may be implemented as a logic circuit, such as an XNOR gate. However, any appropriate logic may be implemented to meet the design criteria of a particular implementation.

The circuit 540 may have a first input 556 coupled to the output 550 of the circuit 542, a second input 558 that may receive the signal TI, a third input 560 that may receive the data signal D, a fourth input 552 that may receive the signal TE, and a fifth input 554 that may receive the control signal BE. The circuit 540 may have an output 562 that is generally coupled to the input 212 of the flip-flop 202. The circuit 542 may have a first input 546 that may receive the signal TI, a second input 544 that may receive the signal BI, and a third input 548 that may receive the data signal D. The signal TI may be presented to the input 210 (and the inputs 546 and 558) in lieu of the signal B1 and the signal BI may be presented to the input 216 (and the inputs 544) in lieu of the signal B2. The circuit 540 may be configured to present the signals D, TI, or BI to the input 212 in response to the signals TE and/or BE. A number of the circuits 1400 may be serially cascaded, for example, vertically, as illustrated in FIG. 3 and configured as a BIST chain. While a multiplexer and an XNOR gate have been described, any appropriate circuits and/or combinations of circuits may be implemented to meet the design criteria of a particular application.

Figure 15:
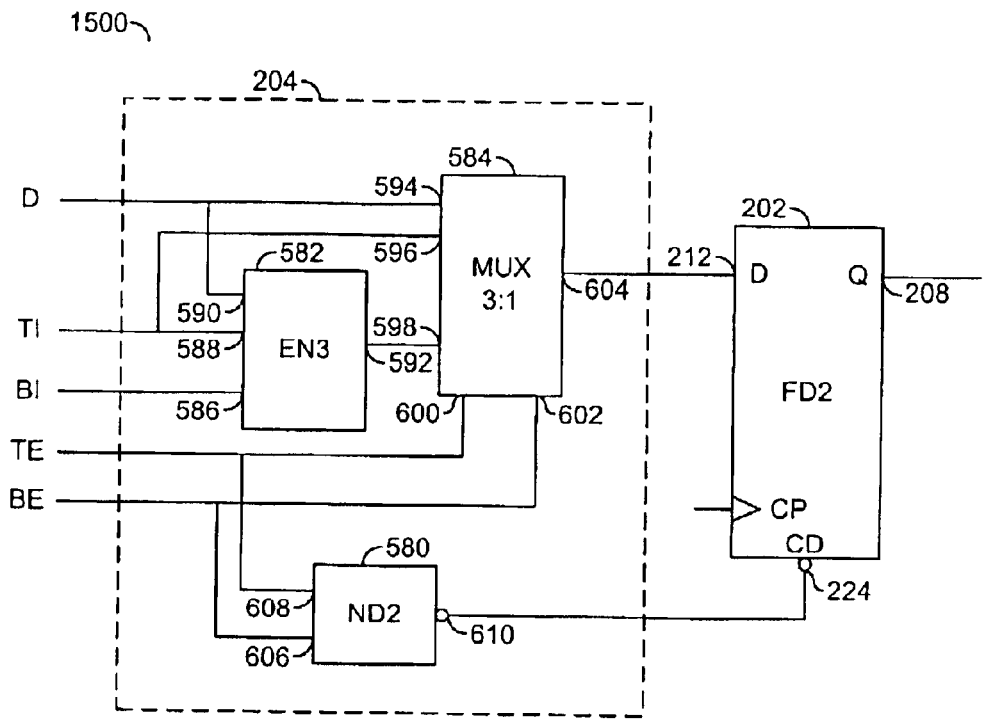
FIG. 15 is a diagram illustrating an example of an advanced dual BIST flip-flop design with scan and asynchronous reset.

Referring to FIG. 15, a diagram of a circuit 1500 illustrating an example of a flip-flop that may be implemented as an alternative dual BIST chain flip-flop with scan and asynchronous reset is shown. The circuit 1500 may be implemented similarly to the circuits 1200 and/or 1400. The circuit 1500 generally comprises a flip-flop 202 and a logic block (or circuit) 204. The circuit 204 generally comprises a block (or circuit) 580, a block (or circuit) 582 and a multiplexer 584. The circuit 580 may be implemented as an AND gate. The circuit 582 may be implemented as a logic circuit, such as an XNOR gate. However, any appropriate logic may be implemented to meet the design criteria of a particular application.

The circuit 582 may have a first input 588 that may receive the signal TI, a second input 586 that may receive the signal BI, and a third input 590 that may receive the data signal D. The circuit 584 may have a first input 598 that may be coupled to the output 592 of the circuit 582, a second input 596 that may receive the signal TI, a third input 594 that may receive the data signal D, a fourth input 600 that may receive the control signal TE, and a fifth input 602 that may receive the control signal BE. The circuit 584 may have an output 604 that is generally coupled to the input 212 of the flip-flop 202.

The output 610 of circuit 580 generally presents the reset signal CD to the input 224 of the flip-flop 202. The circuit 580 may have a first input 606 that may receive the control signal BE and a second input 608 that may receive the control signal TE. A number of the circuits 1500 may be serially cascaded, for example, vertically, as illustrated in FIG. 6 and configured as a dual BIST chain with scan and asynchronous reset. While a multiplexer, an AND gate and an XNOR gate have been described, any appropriate circuits and/or combinations of circuits may be implemented to meet the design criteria of a particular application.

The following TABLE 4 is a truth table illustrating example operating modes of the BIST flip-flop 1500 with scan and asynchronous reset in response to the signals TE and BE:

TABLE 4

| TE | BE | operation mode |
|---|---|---|
| 0 | 0 | functional (D => Q) |
| 0 | 1 | BIST |
| 1 | 0 | SCAN (TI => Q) |
| 1 | 1 | async. reset (0 => Q) |

Figure 16:
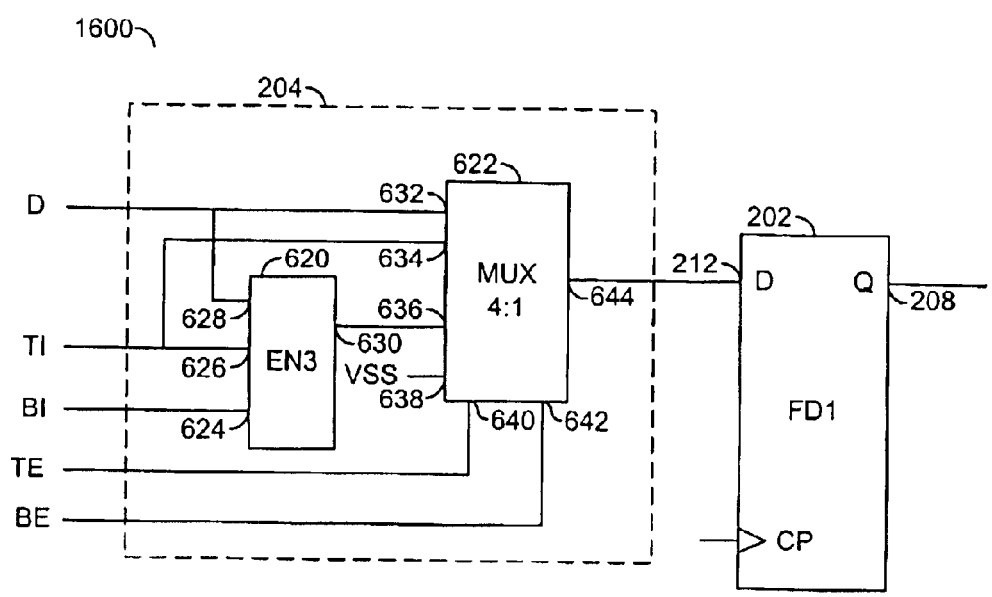
FIG. 16 is a diagram illustrating an example of a dual BIST flip-flop with scan and synchronous reset.

Referring to FIG. 16, a diagram of a circuit 1600 illustrating an example of a flip-flop that may be implemented as a dual BIST chain flip-flop with scan and synchronous reset is shown. The circuit 1600 may be implemented similarly to the circuits 1200 and/or 1400. The circuit 1600 generally comprises a flip-flop 202 and a logic block (or circuit) 204. The circuit 204 generally comprises a block (or circuit) 620 and a multiplexer 622. The circuit 620 may be implemented as a logic circuit, such as an XNOR gate. However, any appropriate logic may be implemented to meet the design criteria of a particular application.

The circuit 620 may have a first input 624 that may receive the signal BI, a second input 626 that may receive the signal TI, and a third input 628 that may receive the data signal D. The circuit 622 may have a first input 636 that may be coupled to the output 630 of the circuit 620, a second input 634 that may receive the signal TI, a third input 632 that may receive the data signal D, a fourth input 640 that may receive the control signal TE, and a fifth input 642 that may receive the control signal BE. The circuit 622 may have an output 644 that is generally coupled to the input 212 for the flip-flop 202. A number of the circuits 1600 may be serially cascaded, for example, vertically, as illustrated in FIG. 3 and configured as a dual BIST chain with SCAN and synchronous reset. While a multiplexer and an XNOR gate have been described, any appropriate circuits and/or combinations of circuits may be implemented to meet the design criteria of a particular application.

The following TABLE 5 is a truth table illustrating example operating modes of the dual BIST flip-flop 1600 with scan and synchronous reset in response to the signals TE and BE:

TABLE 5

| TE | BE | operation mode |
|----|----|----------------|
| 0 | 0 | functional (D => Q) |
| 0 | 1 | BIST |
| 1 | 0 | SCAN (TI => Q) |
| 1 | 1 | sync, reset (0 => Q) |

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a plurality of flip-flops each comprising (i) a first input, (ii) a second input and (iii) an output, wherein (a) each of said outputs are coupled to said first input of a subsequent flip-flop to form a chain, (b) said first input of a first of said flip-flops receives a pattern signal, (c) each of said second inputs receives a respective first logic signal, and (d) each of said outputs presents a respective second logic signal in response to said signals received at said first and second inputs;
   a pattern generator configured to generate said pattern signal; and
   a checking circuit configured to generate a check signal in response to said second logic signal of a last of said flip-flops, wherein said pattern signal and said first logic signals are selected to influence a behavior of said apparatus.

2. The apparatus according to claim 1, wherein said flip-flops further comprise a third input configured to receive a built in self test (BIST) enable signal.

3. The apparatus according to claim 2, wherein said flip-flops further comprise a fourth input configured to receive a scan test enable signal.

4. The apparatus according to claim 1, wherein said plurality of flip-flops are cascaded and configured as a register.

5. The apparatus according to claim 1, wherein said check signal is configured to detect errors that are generated in response to (i) said test pattern signal, (ii) said first logic signal and (iii) said second logic signal.

6. The apparatus according to claim 2, wherein each of said flip-flops further comprises a multiplexer configured to select said first logic signal as said first logic signal or said second logic signal in response to said BIST enable signal.

7. The apparatus according to claim 3, wherein each of said flip-flops further comprises a multiplexer as configured to select said first logic signal as said first logic signal or said second logic signal in response to said BIST enable signal and said scan test enable signal.

8. The apparatus of claim 1, wherein said apparatus comprises a built in self test and scan test circuit.

9. An apparatus comprising:
   a plurality of flip-flops each comprising (i) a first input configured to receive a respective first input signal, (ii) a second input configured to receive a respective second input signal, (iii) a third input configured to receive a respective first logic signal, and (iv) an output configured to present a respective second logic signal in response to said signals received at said first, second, and third circuits, wherein each of said outputs are coupled (i) to said first input of a subsequent flip-flop to form a first chain and (ii) to said second input of a predecessor flip-flop to form a second chain, wherein said first and second input signals and said first logic signal are selected to influence a behavior of said apparatus.

10. The apparatus of claim 9, wherein:
    said output of a last of said flip-flops is coupled to said second input of a first of said flip-flops; and
    said third input of said last of said flip-flops is coupled to said output of said first of said flip-flops.

11. The apparatus of claim 9 further comprising:
    a first pattern generator configured to generate a first pattern signal presented to said second input of a first of said flip-flops;
    a second pattern generator configured to generate a second pattern signal presented to said third input of a last of said flip-flops;
    a first checking circuit configured to generate a first check signal in response to said output of said first of said flip-flops; and
    a second checking circuit configured to generate a second check signal in response to said output of said last of said flip-flops.

12. The apparatus according to claim 11, said flip-flops further comprising a fourth input configured to receive a built in self test (BIST) enable signal.

13. The apparatus according to claim 12, said flip-flops further comprising a fifth input configured to receive a scan test enable signal.

14. The apparatus according to claim 11, wherein said plurality of flip-flops are cascaded and configured as a register.

15. The apparatus according to claim 12, wherein each of said flip-flops further comprises a multiplexer configured to select said first input signal or a logical combination of said first, second, and third input signals as said first logic signal in response to said BIST enable signal.

16. The apparatus according to claim 13, wherein each of said flip-flops further comprises a multiplexer configured to select said first input signal, said second input signal, or a logical combination of said first, second, and third input signals, as said first logic signal in response to said BIST enable signal and said scan test enable signal.

17. The apparatus according to claim 14, wherein one of said flip-flops is configured to receive a supply voltage or a ground potential at said second input if said first and second inputs would receive the same output from the previous flip-flop.

18. The apparatus according to claim 11, wherein said apparatus comprises a built in self test and scan test circuit.

19. The apparatus according to claim 10, wherein said apparatus is configured to be monitored at any of said outputs.

20. An apparatus for implementing a built in self test in a plurality of flip-flops comprising:

means for receiving (i) a respective first input signal, (ii) a respective second input signal, and (iii) a respective third input signal at each of said flip-flops;

means for generating a respective output signal at each of said flip-flops;

means for presenting each of said output signals as said second input signal to a subsequent one of said flip-flops to form a first chain;

means for presenting each of said output signals as said third input signal to a predecessor one of said flip-flops to form a second chain; and means for receiving a respective first logic signal in response to each of said first, second, and third input signals, wherein said first, second, and third input signals are configured to influence a behavior of said apparatus.

21. The apparatus of claim 20, further comprising:

means for presenting a first pattern as said second input signal to a first of said flip-flops;

means for presenting a second pattern as said first input signal to a last of said flip-flops;

means for generating a first check signal in response to said output signal of said first flip-flop; and means for generating a second check signal in response to said output signal of said last flip-flop.

* * * * *